(12) United States Patent
Michikoshi et al.

(10) Patent No.: US 10,290,602 B2
(45) Date of Patent: May 14, 2019

(54) SEMICONDUCTOR DEVICE AND METHOD OF MAKING SEMICONDUCTOR DEVICE

(71) Applicant: SUMITOMO ELECTRIC INDUSTRIES, LTD., Osaka (JP)

(72) Inventors: Hisato Michikoshi, Ibaraki (JP); Hiroshi Notsu, Ibaraki (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/739,283

(22) PCT Filed: Jul. 4, 2016

(86) PCT No.: PCT/JP2016/069806
§ 371 (c)(1),
(2) Date: Dec. 22, 2017

(87) PCT Pub. No.: WO2017/006916
PCT Pub. Date: Jan. 12, 2017

(65) Prior Publication Data
US 2018/0182728 A1 Jun. 28, 2018

(30) Foreign Application Priority Data
Jul. 8, 2015 (JP) .................................. 2015-136561

(51) Int. Cl.
*H01L 23/00* (2006.01)
*H01L 21/48* (2006.01)
(Continued)

(52) U.S. Cl.
CPC .......... *H01L 24/32* (2013.01); *H01L 21/4882* (2013.01); *H01L 23/3675* (2013.01);
(Continued)

(58) Field of Classification Search
None
See application file for complete search history.

(56) References Cited

U.S. PATENT DOCUMENTS

| | | | | |
|---|---|---|---|---|
| 2004/0056349 A1* | 3/2004 | Yamada | ................ | H01L 23/049 257/724 |
| 2007/0175025 A1* | 8/2007 | Tsukamoto | ....... | H01L 23/49822 29/832 |
| 2015/0108510 A1* | 4/2015 | Urano | ..................... | H01L 33/60 257/88 |

FOREIGN PATENT DOCUMENTS

| | | |
|---|---|---|
| JP | 2001-217363 | 8/2001 |
| JP | 2005-129886 | 5/2005 |

(Continued)

OTHER PUBLICATIONS

"Technical expertise to the development of new materials", http://www.griset.com/innovations.php.

*Primary Examiner* — Long Pham
(74) *Attorney, Agent, or Firm* — IPUSA, PLLC

(57) ABSTRACT

Inexpensive production is achieved while avoiding the degradation of electrical performance caused by the lowering of heat dissipation. The base plate 11 used here has a linear expansion coefficient of 2 to 10 ppm/K, which differs from the linear expansion coefficient of the semiconductor chip 13 by an absolute value of 7 ppm/K or smaller. The bonding layer 12 is formed such that the thickness b thereof is 50 micrometers or smaller, which is thinner than the thickness c of the semiconductor chip 13. Since the thickness b of the bonding layer 12 is thinner than the thickness c of the semiconductor chip 13, the bonding layer 12 upon the heating of the semiconductor chip 13 exhibits thermal expansion that is of relatively small significance, and thus follows the expansion and contraction of the base plate 11. Since the linear expansion coefficient of the base plate 11 is (Continued)

set close to that of the semiconductor chip 13, a displacement occurring between the base plate 11 and the semiconductor chip 13 in response to a temperature change is relatively small.

15 Claims, 6 Drawing Sheets

(51) Int. Cl.
*H01L 23/367* (2006.01)
*H01L 23/373* (2006.01)
*H01L 23/14* (2006.01)

(52) U.S. Cl.
CPC .......... *H01L 23/3735* (2013.01); *H01L 24/33* (2013.01); *H01L 24/83* (2013.01); *H01L 23/14* (2013.01); *H01L 24/48* (2013.01); *H01L 24/49* (2013.01); *H01L 24/73* (2013.01); *H01L 2224/29139* (2013.01); *H01L 2224/29144* (2013.01); *H01L 2224/29147* (2013.01); *H01L 2224/29155* (2013.01); *H01L 2224/3201* (2013.01); *H01L 2224/32225* (2013.01); *H01L 2224/32245* (2013.01); *H01L 2224/33181* (2013.01); *H01L 2224/48091* (2013.01); *H01L 2224/48106* (2013.01); *H01L 2224/48227* (2013.01); *H01L 2224/48245* (2013.01); *H01L 2224/48472* (2013.01); *H01L 2224/4903* (2013.01); *H01L 2224/73265* (2013.01); *H01L 2224/83203* (2013.01); *H01L 2924/10253* (2013.01); *H01L 2924/10272* (2013.01); *H01L 2924/181* (2013.01); *H01L 2924/2064* (2013.01); *H01L 2924/3511* (2013.01)

(56) References Cited

FOREIGN PATENT DOCUMENTS

| | | |
|---|---|---|
| JP | 2008-270353 | 11/2008 |
| JP | 02010050189 A * | 3/2010 |
| JP | 2010-258015 | 11/2010 |
| JP | 2011-066250 | 3/2011 |
| JP | 2011-165811 | 8/2011 |
| JP | 2011-216619 | 10/2011 |
| JP | 2012-028674 | 2/2012 |
| JP | 2012-204366 | 10/2012 |
| JP | 2013-099789 | 5/2013 |
| JP | 2014-120639 | 6/2014 |

* cited by examiner

SEMICONDUCTOR DEVICE AND METHOD OF MAKING SEMICONDUCTOR DEVICE

TECHNICAL FIELD

The present invention relates to semiconductor devices and methods of making a semiconductor device, and particularly relates to a semiconductor device and a method of making the same having the structure in which a semiconductor chip is mounted on and electrically coupled to a base plate.

BACKGROUND ART

In order to electrically couple the surface electrodes of a semiconductor chip to a circuit pattern on the surface of an insulating substrate via a lead frame, the surface electrodes of a semiconductor chip and the lead frame may be bonded together through a solder bonding layer having a thickness of 100 micrometers or more. Such a structure is used in some semiconductor devices known in the art (see Patent Document 1, for example). In this type of semiconductor device, distortion and thermal stress occurring in the solder bonding layer due to a difference in the linear expansion coefficient between the semiconductor chip and the lead frame may be reduced, which improves the reliability of bonding between the semiconductor chip and the lead frame.

Further, a buffer plate having a linear expansion coefficient whose value is between the linear expansion coefficient $\alpha_c$ of a semiconductor device and the linear expansion coefficient $\alpha_w$ of an interconnection member may be inserted between a surface electrode of the semiconductor device situated over an insulating substrate and one end of the interconnection member having the other end thereof bonded to an electrode on the insulating substrate. Such a structure is used in some semiconductor devices known in the art (see Patent Document 2, for example). This type of semiconductor device allows thermal stress applied to the bonding part to be reduced, thereby improving reliability against thermal cycle stress.

RELATED-ART DOCUMENTS

Patent Document

Patent Document 1: Japanese Patent Application Publication No. 2005-129886
Patent Document 2: Japanese Patent Application Publication No. 2012-028674

SUMMARY OF THE INVENTION

Problem to be Solved by the Invention

In the semiconductor device disclosed in Patent Document 1, however, the increased thickness of the semiconductor bonding layer causes an increase in thermal resistance to lower heat dissipation, thereby degrading electrical performance upon the heating of the semiconductor chip. The semiconductor device disclosed in Patent Document 2 has a large number of components, which requires a large number of production steps, resulting in the problem of an increase in production cost. In the semiconductor devices described above, a bonding layer having high thermal conductivity and high electrical conductivity generally has a large linear expansion coefficient (e.g., 15 to 25 ppm/K). A differential between such a linear expansion coefficient and the linear expansion coefficient of silicon (Si) or silicon carbide (SiC) of a semiconductor chip or a semiconductor device generates thermal stress, which likely results in the problem of cracking or disconnecting of the bonding layer due to thermal cycle stress.

In consideration of these, it is an object of the present invention to provide a semiconductor device and a method of making a semiconductor device that can be manufactured at low cost while avoiding the degradation of electrical performance of a semiconductor chip resulting from the lowering of heat dissipation.

Another object of the present invention is to provide a semiconductor device and a method of making a semiconductor device in which the unevenness of thickness of a bonding layer is avoided to significantly reduce the possibility of the bonding layer being cracked or disconnected due to the occurrence of thermal stress.

Means to Solve the Problem

In order to achieve the above-noted objective, a semiconductor device of a first embodiment includes a semiconductor chip, a first base plate having a linear expansion coefficient that differs from the linear expansion coefficient of the semiconductor chip by an absolute value of 7 ppm/K or smaller, and a first bonding layer electrically connecting the first base plate to the semiconductor chip and having a thickness thinner than the semiconductor chip.

In order to achieve the above-noted objective, a semiconductor device of a second invention further includes, in addition to the configuration of the first invention, a first heatsink plate having a linear expansion coefficient that differs from the linear expansion coefficient of the first base plate by an absolute value of 7 ppm/K or smaller, and a second bonding layer bonding, to the first heatsink plate, an opposite surface of the first base plate from a surface thereof to which the semiconductor chip is bonded.

In order to achieve the above-noted objective, further, a semiconductor device of a third invention is such that the first bonding layer in the configuration of the first or second invention has a thickness of 50 micrometers or smaller. In order to achieve the above-noted objective, further, a semiconductor device of a fourth invention is such that in any one of the first to third inventions, the first bonding layer is made of a metal sintered compact. This metal sintered compact preferably has a compactness of 96% or higher according to the results of an experiment by the inventors.

In order to achieve the above-noted object, further, a semiconductor device of a fifth invention is such that the first heatsink plate in the second invention is made of a metal compound material which has a linear expansion coefficient that differs from the linear expansion coefficient of the first base plate by an absolute value of 7 ppm/K or smaller, and which has a thermal conductivity of 250 W/mK or higher, wherein the second bonding layer is formed of a sintered compact containing at least one of Ag, Cu, and Ni, or formed of a solder having a melting point of 250 degrees Celsius or higher containing at least one of Au, Zn, Bi, Cu, Pb, and Sn. Here, the metal compound material of the first heatsink plate in the fifth invention may be a copper-invar-copper (CIC) compound material having a thermal conductivity of 280 W/mK or higher in a thickness direction.

In order to achieve the above objective, further, a semiconductor device of an eighth invention further includes, in addition to the configuration of any one of the first to third inventions, a second base plate having a linear expansion coefficient that differs from the linear expansion coefficient of the semiconductor chip by an absolute value of 7 ppm/K or smaller, and a third bonding layer having a thickness of 50 micrometers or smaller, and bonding, to the second base plate, an opposite surface of the semiconductor chip from a surface thereof which is bonded to the first base plate.

In order to achieve the above objective, further, a semiconductor device of a ninth invention further includes, in addition to the configuration of the first or second invention, a second base plate having a linear expansion coefficient that differs from the linear expansion coefficient of the semiconductor chip by an absolute value of 7 ppm/K or smaller, a third bonding layer having a thickness of 50 micrometers or smaller, and bonding, to the second base plate, an opposite surface of the semiconductor chip from a surface thereof which is bonded to the first base plate, a second heatsink plate having a linear expansion coefficient that differs from the linear expansion coefficient of the second base plate by an absolute value of 7 ppm/K or smaller, and a fourth bonding layer bonding, to the second heatsink plate, an opposite surface of the second base plate from a surface thereof to which the semiconductor chip is bonded. Here, the first base plate in the first to ninth inventions may be a stacked-layer structure in which a first conductive layer, an insulating layer, and a second conductive layer are stacked in a thickness direction.

In order to achieve the above-noted objective, further, a method of making a semiconductor device according to the present invention includes a first step of forming a structure which has, upon the first heatsink plate of any one of the second to fourth inventions, a solid bonding material for the second bonding layer, the first base plate, a solid conductive bonding material for the first bonding layer, and the semiconductor chip having a linear expansion coefficient that differs from the linear expansion coefficient of the first base plate by an absolute value of 7 ppm/K or smaller, successively stacked in this order, and a second step of bonding the first heatsink plate and the base plate via the second bonding layer obtained by melting the solid bonding material for the second bonding layer upon heating an entirety of the structure, and, simultaneously therewith, bonding the base plate and the semiconductor chip via the first bonding layer having the predetermined thickness obtained by melting the solid conductive bonding material for the first bonding layer.

Advantage of the Invention

According to the present invention, low cost manufacturing is enabled while avoiding the degradation of electrical performance of a semiconductor chip resulting from the lowering of heat dissipation. According to the present embodiment, further, the unevenness of thickness of a bonding layer is reduced, and, also, the occurrence of cracking or disconnecting of a bonding layer due to thermal stress is significantly reduced.

MODE FOR CARRYING OUT THE INVENTION

Figure 1:
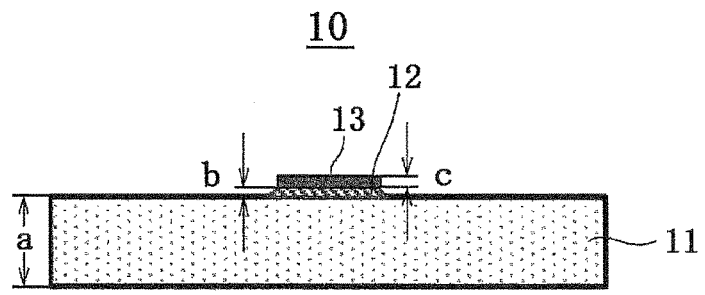
FIG. 1 is a cross-sectional view of the structure of a first embodiment of a semiconductor device according to the present invention.

In the following, embodiments of a semiconductor device according to the present invention will be described in detail by referring to the drawings.

First Embodiment

FIG. 1 is a cross-sectional view of the structure of the first embodiment of a semiconductor device according to the present invention. In this figure, a semiconductor device 10 of the present embodiment has a structure in which a base plate 11 having a thickness "a" is electrically connected to a semiconductor chip 13 having a thickness "c" via an electrically conductive bonding layer 12 having a thickness "b". A circuit pattern on a surface of the base plate 11, for example, may be coupled to the semiconductor chip 13 through the electrically conductive bonding layer 12.

The base plate 11 used here has a linear expansion coefficient close to the linear expansion coefficient of the semiconductor chip 13, and, more specifically, has a linear expansion coefficient that differs from the linear expansion coefficient of the semiconductor chip 13 by an absolute value of 7 ppm/K or smaller. The condition that the absolute value of a difference between the linear expansion coefficient of the base plate 11 and the linear expansion coefficient of the semiconductor chip 13 is 7 ppm/K or smaller has a basis on the results of a prototype experiment conducted by the inventors. With this arrangement, a resultant displacement between the base plate 11 and the semiconductor chip 13 does not exceed a predetermined tolerable range in response to a temperature change upon the heating of the semiconductor chip 13. In the example used here, the linear expansion coefficient of the semiconductor chip 13 is 3 to 4 ppm/K, and the linear expansion coefficient of the base plate 11 is 2 to 10 ppm/K.

The bonding layer 12 is firmly bonded to the surface of the base plate 11 and also bonded to a surface of the semiconductor chip 13. A noticeable feature is that an employed thickness "b" of the bonding layer 12 is substantially thinner than the thickness "c" of the semiconductor chip 13. Specifically, the bonding layer 12 is formed such that the thickness "b" is 50 micrometers or smaller. The semiconductor chip 13 may be a device which is referred to as a power semiconductor device, for example, comprised of silicon (Si), silicon carbide (SiC), or gallium nitride (GaN). The thickness "c" of the semiconductor chip 13 is substantially thinner than the thickness "a" of the base plate 11. In this example, the thickness "c" of the semiconductor chip 13 is 350 micrometers. A chip with a thickness of 100 micrometers, more or less, may alternatively be used. The thickness "a" of the base plate 11 is typically 0.92 mm. A base plate with a thickness of 1.2 mm or 0.62 mm may alternatively be used.

The semiconductor device 10 of the present embodiment allows the bonding layer 12 to be made thinner, which serves to avoid the unevenness of bonding thickness. Even when stress is generated at the bonding layer 12, the stress is dispersed without concentrating on a single point, which ensures the reliability of bonding. Applying a large amount of bonding material for the purpose of ensuring a sufficient thickness of bonding layer to secure reliability causes the unevenness of thickness of the bonding layer to be increased, resulting in concerns that stress ends up being concentrated to undermine reliability. In order to avoid this problem, metal particles made of high-melting-point nickel (Ni) or the like may be evenly dispersed in the solder serving as a bonding material for the purpose of serving a role as a spacer in some semiconductor devices which are known in the art (see Japanese Patent Application Publication No. 2013-99789, for example). This type of semiconductor devices require a production step for dispersing metal particles, giving rise to a problem of increased manufacturing cost.

The semiconductor device 10 of the present embodiment also ensures reliability regardless of the mechanical property of the bonding layer 12 even when the thickness of the bonding layer 12 is decreased. Because of this, a bonding material that does not readily ensure reliability in a conventional setting is usable as the bonding layer 12. For example, the bonding layer 12 may be made of a sintered compact containing at least one of silver (Ag), copper (Cu), and nickel (Ni), which are superior in thermal stability and thermal conductivity but are not suitable for stress mitigation due to their high mechanical strength and high modulus of elasticity compared with tin (Sn), or may be made of solder having a melting point of 250 degrees Celsius or higher and containing at least one of gold (Au), zinc (Zn), bismuth (Bi), Cu, lead (Pb), and Sn.

Some materials which characteristically allow fine particles thereof made into a paste to be bonded together upon application of heat under pressure or under no pressure may conventionally be considered to be unsuitable for securing reliability because the paste has low viscosity such as to increase the dispersibility of fine particles, and, thus, is not able to ensure sufficient thickness upon being applied. Notwithstanding this, such materials are usable as the bonding layer 12 and provide high reliability. Further, a sintered compact made of Ag, Cu, or Ni, which is unable to ensure sufficient reliability without applied pressure during the application of heat, may be sintered in a pressureless process into the bonding layer 12, which is still able to provide reliability.

Fine metal particles such as Ag particles, Au particles, or Ni or Cu particles may be made into a paste to create a paste layer between a metal substrate and a semiconductor chip placed thereon, followed by placing this structure in a forming press, and then applying heat to the entirety of the device with a baking machine or the like, while applying pressure, to create a bonding layer through calcination of the paste layer. Such a bonding layer may be used to bond the metal substrate and the semiconductor chip according to some methods of making a power module semiconductor device which are known in the art (see Japanese Patent Application Publication No. 2014-120639, for example). This publication also discloses that the paste layer having a thickness of approximately 50 micrometers, for example, is compressed through calcination into the post-calcination bonding layer which is about 20 micrometers to about 30 micrometers in thickness. Accordingly, the semiconductor device disclosed in this publication also has a bonding layer that is 50 micrometers or smaller in thickness.

Further, the above-noted publication discloses that in the case of a semiconductor chip being SiC, the linear expansion coefficient of the chip is smaller than the linear expansion coefficient of the bonding layer made of Ag nanoparticles, and stress caused by such a difference is applied to the semiconductor chip and to the bonding layer, but such a stress is mitigated by a fillet layer with a tapered shape disposed at the sidewalls of the semiconductor chip and the bonding layer.

In contrast, the structure of the present embodiment utilizes the base plate 11 having a linear expansion coefficient that differs from the linear expansion coefficient of the semiconductor chip 13 by 7 ppm/K or smaller in absolute value. The use of such a structure serves to provide a relatively smaller displacement between the base plate 11 and the semiconductor chip 13 upon a temperature change. Further, the thickness "b" of the bonding layer 12 is made thinner than the thickness "c" of the semiconductor chip 13, which reduces the relative significance of thermal expansion of the bonding layer 12 upon the heating of the semiconductor chip 13. These collaborating factors allow the thermal distortion occurring between the bonding layer 12 and the semiconductor chip 13 in response to a temperature change to be reduced as long as the bonding layer 12 is bonded to the base plate 11 with sufficient strength. This arrangement serves to reduce the degradation of electrical performance of the semiconductor chip 13 resulting from the lowering of heat dissipation. Such a structure is not disclosed in the above-noted publication. Moreover, the present embodiment does not need a production step for forming a fillet layer with a tapered shape, and is also advantageous in that simple manufacturing steps are used for production as will be described later. It may be noted that the base plate 11 of the present embodiment is an insulating layer, but may alternatively be a metal substrate as in the above-noted publication.

Further, the semiconductor device 10 of the present embodiment can be manufactured through an extremely small number of production steps which involve electrically connecting the semiconductor chip 13 to the base plate 11 through the bonding layer 12. An increase in manufacturing cost, which is a problem in the semiconductor device disclosed in Patent Document 2, is thus avoided. Moreover, the semiconductor device 10 of the present embodiment serves to provide improved reliability against thermal cycle stress in comparison with the related art. In this case, the mechanical property of the bonding layer 12 is not limited as long as the bonding layer 12 can be bonded to the base plate 11 with sufficient strength.

Second Embodiment

Figure 2:
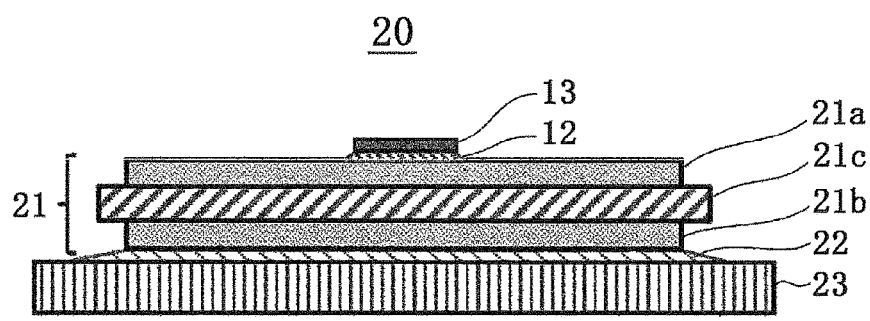
FIG. 2 is a cross-sectional view of the structure of a second embodiment of a semiconductor device according to the present invention.

In the following, a second embodiment of the semiconductor device according to the present invention will be described. FIG. 2 is a cross-sectional view of the structure of the second embodiment of a semiconductor device according to the present invention. In this drawing, the same elements as those of FIG. 1 are referred to by the same symbols, and a description thereof will be omitted. A semiconductor device 20 of the second embodiment illustrated in FIG. 2 is characterized in that a base plate 21 has a three-layer structure having a flat plate insulating body 21c placed between flat plate conductive bodies 21a and 21b, and the semiconductor chip 13 is electrically connected to a surface of the conductive body 21a via the bonding layer 12, with a heatsink plate 23 being bonded to a surface of the conductive body 21b via a bonding layer 22.

The semiconductor device 20 of the present embodiment has a structure in which the heatsink plate 23 is bonded via the bonding layer 22 to the opposite surface of the base plate 21 from the surface on which the semiconductor chip 13 is bonded. The thickness of the bonding layer 22 is 50 micrometers or smaller, which is sufficiently thinner than the thickness of the semiconductor chip 13. The linear expansion coefficient of the heatsink plate 23 is set to a value that is close to the linear expansion coefficient of the base plate 21. Specifically, the value is set such as to differ from the linear expansion coefficient of the base plate 21 by an absolute value of 7 ppm/K or smaller. In the semiconductor device 20 of the present embodiment, the heatsink plate 23 is electrically bonded to the conductive body 21b of the base plate 21 via the bonding layer 22, but is not electrically coupled to the semiconductor chip 13 because of the insulating body 21c of the base plate 21. Even with such a structure, heat generated by the semiconductor chip 13 is transmitted to the heatsink plate 23 through the bonding layer 12, the base plate 21, and the bonding layer 22, thereby being dissipated. It may be noted that the heatsink plate 23 does not have to be electrically coupled to the base plate 21 via the bonding layer 22.

Power modules (i.e., power semiconductor devices) often have the structure in which a base plate and a heatsink plate are connected by solder. In such a case, the bonding area between the base plate and the heatsink plate is larger than the bonding area between the semiconductor chip and the base plate, which causes a greater thermal distortion. As a result, cracks may develop in the bonding layer, and may lead to a decreased bonding area, giving rise to concern that heat dissipation is degraded. According to the semiconductor device 20 of the present embodiment, however, the thickness of the bonding layer 22 is thin, and the linear expansion coefficient of the base plate 21 is close to the linear expansion coefficient of the heatsink plate 23, so that a displacement between the base plate 21 and the heatsink plate 23 caused by a temperature change is relatively small. As a result, thermal distortion occurring between the base plate 21 and the heatsink plate 23 is reduced by a large extent.

According to the semiconductor device 20 of the present embodiment, further, the absolute value of a difference in the displacement between the base plate 21 and the heatsink plate 23 in response to a temperature change is small, which serves to avoid problems such as reduction in the heat dissipation area and lowering in cooling performance due to the warpage of the base plate 21 and the heatsink plate 23. Moreover, the semiconductor device 20 of the present embodiment serves to avoid the unevenness of bonding thickness because the bonding layers 12 and 22 can be made thin as in the case of the semiconductor device 10. Even when stress occurs at the bonding layers 12 and 22, the stress is dispersed without concentrating at a single point.

Third Embodiment

Figure 3:
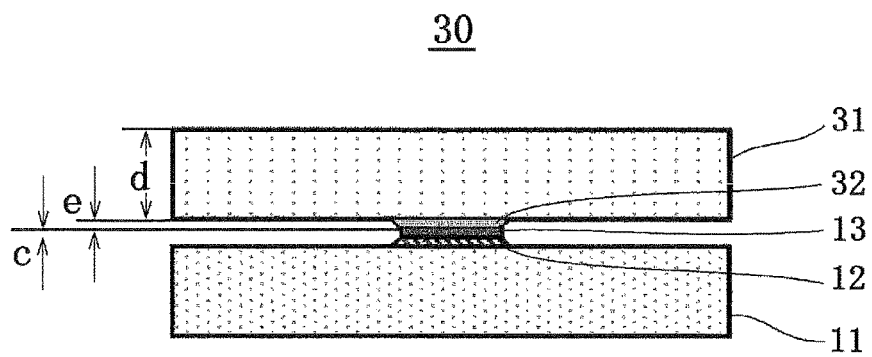
FIG. 3 is a cross-sectional view of the structure of a third embodiment of a semiconductor device according to the present invention.

In the following, a third embodiment of the semiconductor device according to the present invention will be described. FIG. 3 is a cross-sectional view of the structure of the third embodiment of a semiconductor device according to the present invention. In this drawing, the same elements as those of FIG. 1 are referred to by the same symbols, and a description thereof will be omitted. A semiconductor device 30 of the third embodiment illustrated in FIG. 3 is characterized in that a second base plate 31 is electrically coupled via a second conductive bonding layer 32 to the opposite surface of the semiconductor chip 13 from the surface to which the base plate 11 is bonded.

The base plate 31 used here has a linear expansion coefficient close to the linear expansion coefficient of the semiconductor chip 13, and, more specifically, has a linear expansion coefficient that differs from the linear expansion coefficient of the semiconductor chip 13 by 7 ppm/K or smaller in absolute value. The base plate 31 used here has a linear expansion coefficient of 2 to 10 ppm/K that is the same as the base plate 11. The bonding layer 32 is firmly bonded to the surface of the base plate 31 and also electrically bonded to the surface of the semiconductor chip 13. The thickness "e" of the bonding layer 32 is made substantially thinner than the thickness "c" of the semiconductor chip 13. In this example, the thickness "c" of the semiconductor chip 13 may be 350 micrometers, and the thickness "e" of the bonding layer 32 may be 50 micrometers or smaller similarly to the thickness "b" of the bonding layer 12. The thickness "d" of the base plate 31 is sufficiently thicker than the thickness "c" of the semiconductor chip 13.

Since the semiconductor device 30 of the present embodiment has the bonding layer 32 with the thickness "e" thereof thinner than the thickness "c" of the semiconductor chip 13, the relative significance of thermal expansion of the bonding layer 32 upon the heating of the semiconductor chip 13 is small, which results in the bonding layer 32 expanding and contracting in response to the expansion and contraction of the base plate 31, respectively. Further, in the semiconductor device 30 of the present embodiment, the linear expansion coefficient of the base plate 31 is set to a value close to that of the semiconductor chip 13, which results in a relatively small displacement between the base plate 31 and the semiconductor chip 13 upon a temperature change. As a result, thermal distortion occurring between the bonding layer 32 and the semiconductor chip 13 in response to a temperature change is reduced as long as the bonding layer 32 is bonded to the base plate 31 with sufficient strength. In this manner, the semiconductor device 30 of the present embodiment has the base plate 31 and the bonding layer 32 that provide the same results as the previously noted results provided by the base plate 11 and the bonding layer 12 of the semiconductor device 10.

Fourth Embodiment

Figure 4:
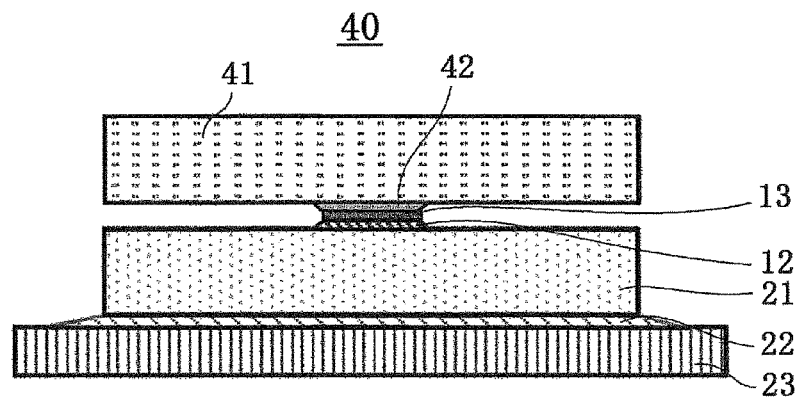
FIG. 4 is a cross-sectional view of the structure of a fourth embodiment of a semiconductor device according to the present invention.

In the following, a fourth embodiment of the semiconductor device according to the present invention will be described. FIG. 4 is a cross-sectional view of the structure of the fourth embodiment of a semiconductor device according to the present invention. In this drawing, the same elements as those of FIG. 2 are referred to by the same symbols, and a description thereof will be omitted. A semiconductor device 40 of the fourth embodiment illustrated in FIG. 4 is characterized in that a second base plate 41 is electrically coupled via a second conductive bonding layer 42 to the opposite surface of the semiconductor chip 13 from the surface on which the base plate 21 and the heatsink plate 23 are formed in the semiconductor device 20 of the second embodiment.

The base plate 41 used here has a linear expansion coefficient close to the linear expansion coefficient of the semiconductor chip 13, and, more specifically, has a linear expansion coefficient that differs from the linear expansion coefficient of the semiconductor chip 13 by an absolute value of 7 ppm/K or smaller. The base plate 41 used here has a linear expansion coefficient of 2 to 10 ppm/K that is the same as the base plate 21. The bonding layer 42 is firmly bonded to the surface of the base plate 41 and also electrically bonded to the surface of the semiconductor chip 13. The thickness of the bonding layer 42 is made substantially thinner than the thickness of the semiconductor chip 13. In this example, the thickness of the semiconductor chip 13 may be 350 micrometers, and the thickness of the bonding layer 42 may be 50 micrometers or smaller, which is the same as the thickness of the bonding layer 22. The thickness "d" of the base plate 41 is sufficiently thicker than the thickness of the semiconductor chip 13.

According to the semiconductor device 40 of the fourth embodiment having the structure described above, the thermal distortion occurring between the bonding layer 42 and the semiconductor chip 13 in response to a temperature change is reduced as long as the bonding layer 42 is bonded to the base plate 41 with sufficient strength. Because of this, the base plate 41 and the bonding layer 42 provide the same results as the previously noted results provided by the base plate 11 and the bonding layer 12 of the semiconductor device 10.

Fifth Embodiment

Figure 5:
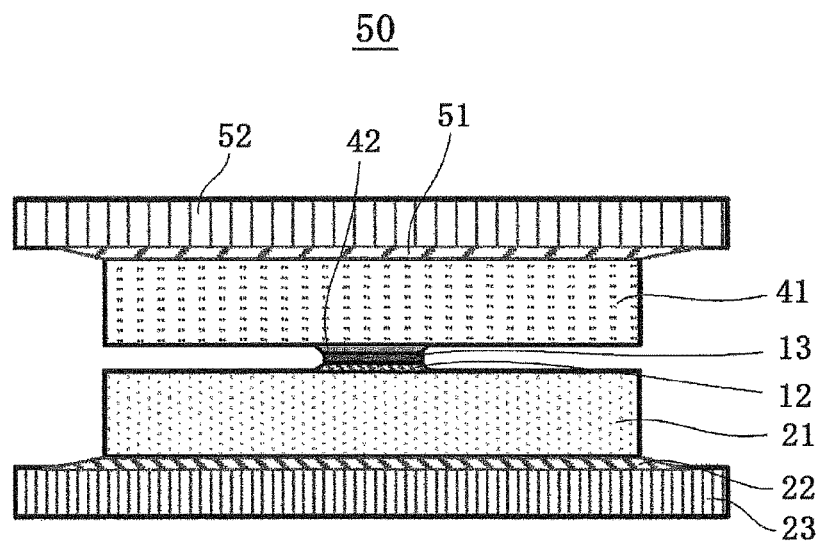
FIG. 5 is a cross-sectional view of the structure of a fifth embodiment of a semiconductor device according to the present invention.

In the following, a fifth embodiment of the semiconductor device according to the present invention will be described. FIG. 5 is a cross-sectional view of the structure of the fifth embodiment of a semiconductor device according to the present invention. In this drawing, the same elements as those of FIG. 4 are referred to by the same symbols, and a description thereof will be omitted. A semiconductor device 50 of the fifth embodiment illustrated in FIG. 5 is characterized in that a second heatsink plate 52 is bonded via a bonding layer 51 to the opposite surface of the base plate 41 from the surface to which the semiconductor chip 13 is bonded in the semiconductor device 40 of the fourth embodiment.

In the semiconductor device 50 illustrated in FIG. 5, the thickness of the bonding layer 51 is 50 micrometers or smaller. The linear expansion coefficient of the heatsink plate 52 is set to a value that is close to the linear expansion coefficient of the base plate 41. Specifically, the value is set such as to differ from the linear expansion coefficient of the base plate 41 by 7 ppm/K or smaller in absolute value. According to the semiconductor device 50 of the present embodiment, the configuration having the base plate 41, the bonding layer 51, and the heatsink plate 52 provides the same results as the results provided by the configuration having the base plate 21, the bonding layer 22, and the heatsink plate 23 described by referring to FIG. 2.

Sixth Embodiment

Figure 6:
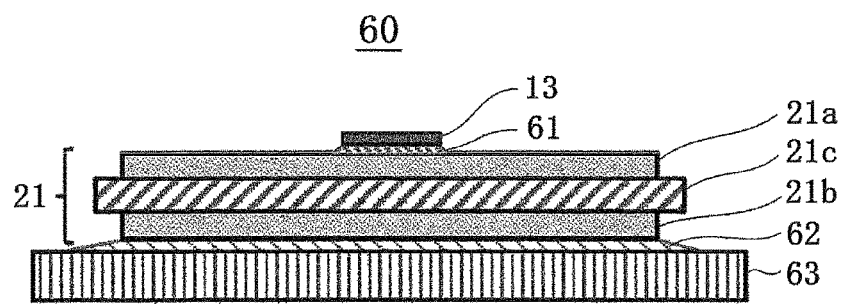
FIG. 6 is a cross-sectional view of the structure of a sixth embodiment of a semiconductor device according to the present invention.

In the following, a sixth embodiment of the semiconductor device according to the present invention will be described. FIG. 6 is a cross-sectional view of the structure of the sixth embodiment of a semiconductor device according to the present invention. In this drawing, the same elements as those of FIG. 2 are referred to by the same symbols, and a description thereof will be omitted. A semiconductor device 60 of the sixth embodiment illustrated in FIG. 6 has a structure aimed at improving heat dissipation and reliability against thermal cycle stress to a further extent in comparison with the semiconductor device 20 of the second embodiment. This structure is suitable for application to power modules.

The semiconductor device 60 of the present embodiment is structured such that the upper conductive body 21a of the base plate 21 serving as an insulating substrate is electrically connected to the semiconductor chip 13 via a first bonding layer 61, and the lower conductive body 21b of the base plate 21 is bonded to a heatsink plate 63 via a second bonding layer 62. Characteristic features lie in the materials of the bonding layers 61 and 62 and the heatsink plate 63. The base plate 21 used here has a linear expansion coefficient close to the linear expansion coefficient of the semiconductor chip 13 as in the case of the semiconductor device 20, and, more specifically, has a linear expansion coefficient that differs from the linear expansion coefficient of the semiconductor chip 13 by an absolute value of 7 ppm/K or smaller. The bonding layer 61 is formed as a metal sintered compact having a thickness of 50 micrometers or smaller, which is sufficiently thinner than the thickness of the semiconductor chip 13. A metal sintered compact is known to exhibit an increased thermal conductivity as the compactness increases. In the present embodiment, a metal sintered compact with a compactness of 96% or higher is preferably used as the bonding layer 61 according to the results of a prototype experiment conducted by the inventors. The compactness of a metal sintered compact is a value (in units of %) obtained by dividing the density of a metal sintered compact by the theoretical density of a metal constituting the sintered compact. The bonding layer 62 is formed as a sintered compact containing at least one metal among Ag, Cu, and Ni, or as a solder material having a melting point of 250 degrees Celsius or higher containing at least one of Au, Zn, Bi, Cu, Pb, and Sn.

In contrast, the heatsink plate 23 of the semiconductor device 20 previously described or the heatsink plate 63 of the semiconductor device 60 of the present embodiment is made of a metal compound material having a thermal conductivity of 250 W/mK or higher and having such a linear expansion coefficient that the absolute value of a difference from the linear expansion coefficient of the base plate 21 is 7 ppm/K or smaller. As a metal compound material of this type, AlSiC, which is an alloy compound material of SiC and aluminum (Al), Cu—W, which is a metal compound material of copper (Cu) and tungsten (W), or Cu—Mo, which is a metal compound material of copper and molybdenum (Mo), may be used as the heatsink plate 23 of the semiconductor device 20.

However, while these metal compound materials have such a linear expansion coefficient that the absolute value of a difference from the linear expansion coefficient of the base plate 21 is 7 ppm/K or smaller, their thermal conductivity is lower than Cu (i.e., thermal resistance is higher). Because of this, the use of such materials for a heatsink plate does not provide sufficient heat dissipation. Decreasing the thickness of the bonding layer 23 with expectations for the improvement of heat dissipation still fails to provide sufficient heat dissipation for the structure as a whole. The thermal conductivity and linear expansion coefficient of these metal compound materials and copper are in public knowledge. The higher the thermal conductivity of a material is, the higher the linear expansion coefficient of the material is (see http://www.griset.com/innovations.php, for example). In consideration of this, the metal compound material used as the heatsink plate 63 in the present embodiment has a linear expansion coefficient that differs from the linear expansion coefficient of the base plate 21 by an absolute value of 7 ppm/K or smaller, and has a thermal conductivity of 250 W/mK or higher, which is higher than that of Cu. In this example, a copper-invar-copper (CIC) compound material is used.

Figure 7:
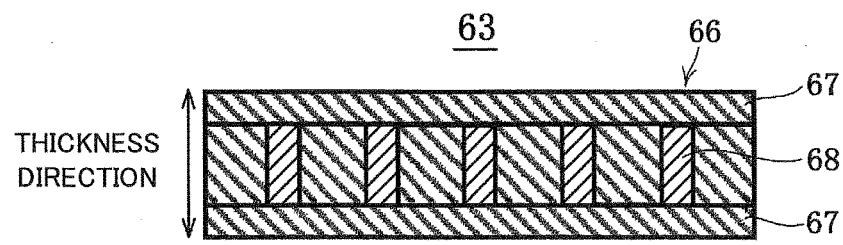
FIG. 7 is a cross-sectional view of an example of a heatsink plate 63 illustrated in FIG. 6.

FIG. 7 is a cross-sectional view of an example of the heatsink plate 63 illustrated in FIG. 6. In FIG. 7, the heatsink plate 63 is a copper-invar-copper (CIC) compound material 66 in which invar 68, i.e., an alloy of iron (Fe) mixed with Ni, is disposed at constant intervals in the width direction in a middle layer between upper and lower layers 67 comprised of Cu, providing a structure which has anisotropy in the thickness direction. This copper-invar-copper compound material 66 has a high thermal conductivity of 280 W/mK or higher in the thickness direction.

In the semiconductor device 60 of the present embodiment, the heatsink plate 63 is electrically coupled to the conductive body (i.e., 21b in FIG. 2) of the base plate 21 via the bonding layer 62, but is not electrically coupled to the semiconductor chip 13 due to the presence of the insulating body (i.e., 21c in FIG. 2) of the base plate 21. Even with such a structure, heat generated by the semiconductor chip 13 is transmitted to the heatsink plate 63 through the bonding layer 61, the base plate 21, and the bonding layer 62, thereby being dissipated through the heatsink plate 63. It may be noted that the entirety of the semiconductor device 60 may be stored in a resin case which is not illustrated, with the semiconductor chip 13 and the base plate 21 being aluminum-wire-bonded to the terminals of the resin case as device interconnections. All of these may further be encapsulated with silicone gel filling the inside of the resin case.

As described above, the semiconductor device 60 of the present embodiment has the bonding layer 61 whose thickness is made thinner than the thickness of the semiconductor chip 13, so that the relative significance of thermal expansion of the bonding layer 61 upon the heating of the semiconductor chip 13 is small. In addition, the linear expansion coefficient of the base plate 21 is set to a value close to that of the semiconductor chip 13. Because of this, a displacement occurring between the base plate 21 and the semiconductor chip 13 in response to a temperature change is relatively small. As a result, the semiconductor device 60 is expected to bring about improvement in reliability against stress caused by thermal cycles as in the semiconductor device 20 of the second embodiment.

However, the heatsink plate 23 of the semiconductor device 20 is made of a metal compound material such as AlSiC, Cu—W, or Cu—Mo, which has a lower thermal conductivity (i.e., higher thermal resistance) than Cu. The low heat dissipation of the heatsink plate 23 cancels out a decrease in the thickness of the bonding layers 61 and 62 that is made with expectations for improvement in heat dissipation, thereby failing to provide sufficient improvement in heat dissipation. In contrast, the semiconductor device 60 of the present embodiment uses as the heatsink plate 63 a metal compound material having a thermal conductivity of 250 W/mK or higher, which is higher than that of Cu, thereby successfully providing improved heat dissipation in comparison with the semiconductor device 20. Namely, the basis for the condition that the metal compound material is 250 W/mK or higher lies in the fact that such a value is considered to provide improved heat dissipation in comparison with the semiconductor device 20. In this manner, the semiconductor device 60 is expected to achieve the coexistence of improvement in heat dissipation with improvement in reliability against thermal cycle stress. Thermal distortion occurring between the base plate 21 and the heatsink plate 63 is reduced, and no cracks develop in the bonding layer 62, thereby eliminating the concern that a decrease in the bonding area may degrade heat dissipation.

According to the semiconductor device 60, further, the absolute value of a difference between the linear expansion coefficient of the heatsink plate 63 and the linear expansion coefficient of the base plate 21 is set lower than or equal to 7 ppm/K, so that the absolute value of a difference in the displacement between the base plate 21 and the heatsink plate 63 in response to a temperature change is relatively small. This results in the avoidance of problems such as a decrease in the area of heat dissipation and lowering in cooling performance caused by the warpage of the base plate 21 and the heatsink plate 63. Moreover, the semiconductor device 60 serves to avoid the unevenness of bonding thickness because the bonding layers 61 and 62 situated on the upper and lower surfaces of the base plate can be made thin as in the case of the semiconductor devices 10 and 20. Even when stress occurs at the bonding layers 61 and 62, the stress is dispersed without concentrating at a single point.

In the following, the outline of a method of making a semiconductor device of the present invention will be described.

Figure 8:
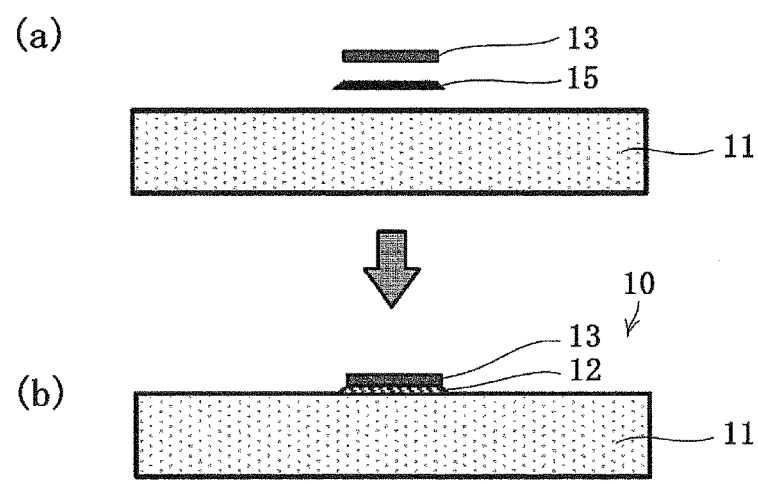
FIG. 8 is a cross-sectional view of a device observed at each production step schematically illustrating an example of a method of making the first embodiment of a semiconductor device according to the present invention.

FIG. 8 is a cross-sectional view of a device observed at each production step schematically illustrating an example of a method of making a first embodiment of the semiconductor device according to the present invention. In this drawing, the same elements as those of FIG. 1 are referred to by the same symbols, and a description thereof will be omitted. As illustrated in FIG. 8(a), a solid conductive bonding material 15 having a thickness of approximately 50 micrometers and made of a predetermined material is placed on a circuit pattern situated on the surface of the base plate 11 made of Si or SiC and having a linear expansion coefficient of 2 to 10 ppm/K. Further, the semiconductor chip 13 is disposed such that an electrode surface thereof comes in contact with the conductive bonding material 15. The semiconductor chip 13 has a thickness of 350 micrometers and a linear expansion coefficient of 3 to 4 ppm/K.

With the solid conductive bonding material 15 and the semiconductor chip 13 stacked in this order on the base plate 11, heat is applied to melt the conductive bonding material 15, thereby making the semiconductor device 10 of the first embodiment having the structure in which the electrodes of the semiconductor chip 13 are bonded through the conductive bonding layer 12 to the circuit pattern situated on the base plate 11 as illustrated in FIG. 8(b). The bonding layer 12, which is obtained by melting the conductive bonding material 15, has a thickness of 50 micrometers or smaller. It may be noted that during the above-noted heating process, heat may be applied while pressure is applied.

Figure 9:
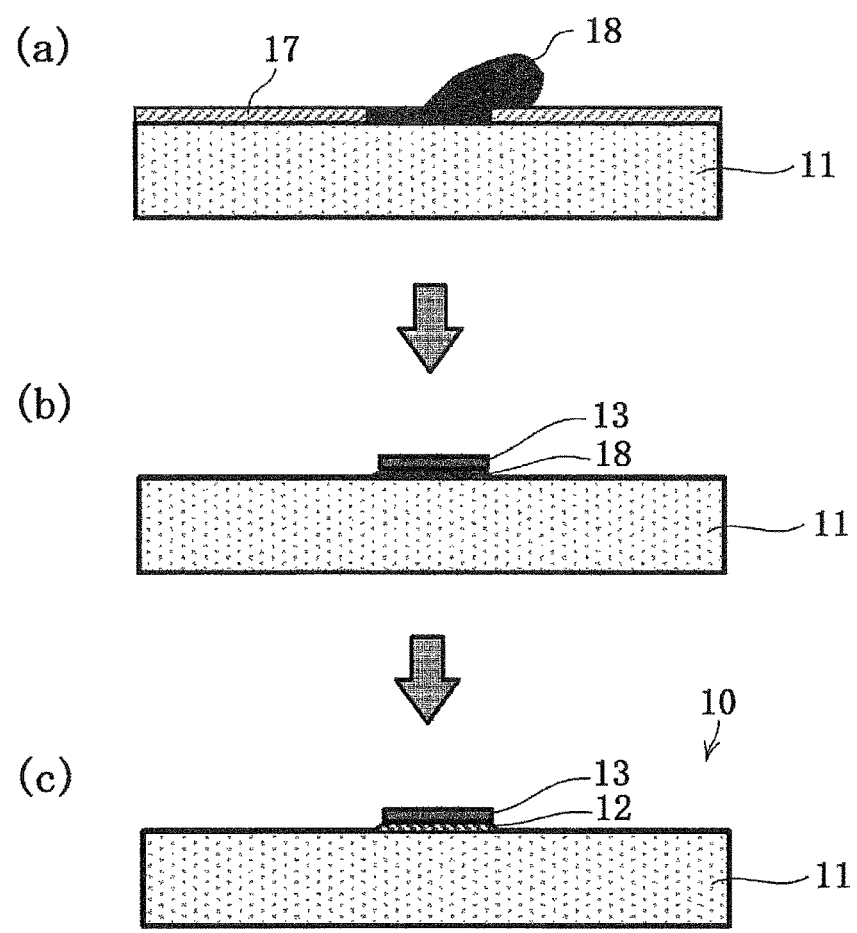
FIG. 9 is a cross-sectional view of a device observed at each production step schematically illustrating another example of a method of making the first embodiment of a semiconductor device according to the present invention.

FIG. 9 is a cross-sectional view of a device observed at each production step schematically illustrating another example of a method of making a first embodiment of the semiconductor device according to the present invention. In this drawing, the same elements as those of FIG. 1 are referred to by the same symbols, and a description thereof will be omitted. As illustrated in FIG. 9(a), a mask 17 having an opening situated to expose a circuit pattern on the base plate 11 is placed on the base plate 11 having a linear expansion coefficient of 2 to 10 ppm/K and made of Si or SiC. A conductive bonding material 18 in paste form is then applied from above the mask 17. It follows that the conductive bonding material 18 in paste form comes in contact with the circuit pattern on the base plate 11 through the opening of the mask 17.

Subsequently, the mask 17 is removed from the upper surface of the base plate 11, and, then, the semiconductor chip 13 is placed such that an electrode surface thereof comes in contact with the conductive bonding material 18 in paste form, as illustrated in FIG. 9(b). With the conductive bonding material 18 in paste form and the semiconductor chip 13 stacked in this order on the base plate 11, heat is applied to melt the conductive bonding material 18, thereby making the semiconductor device 10 of the first embodiment having the structure in which the electrodes of the semiconductor chip 13 are bonded through the conductive bonding layer 12 to the circuit pattern situated on the base plate 11 as illustrated in FIG. 9(c). The bonding layer 12, which is obtained by melting the conductive bonding material 18, has a thickness of 50 micrometers or smaller. It may be noted that during the above-noted heating process, heat may be applied while pressure is applied.

According to the production methods illustrated in FIG. 8 and FIG. 9, the semiconductor device 10 can be made through an extremely small number of production steps involving electrically coupling the semiconductor chip 13 to the base plate 11 while heating the conductive bonding material 15 or 18. These methods thus eliminate the problem of an increase in manufacturing cost as observed in the semiconductor device disclosed in Patent Document 2.

Figure 10:
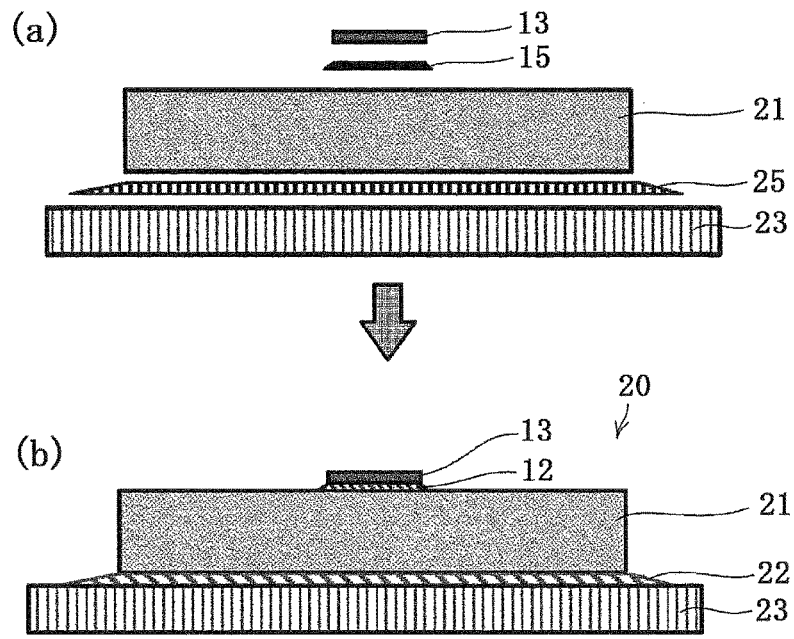
FIG. 10 is a cross-sectional view of a device observed at each production step schematically illustrating an embodiment of a method of making a semiconductor device according to the present invention.

FIG. 10 is a cross-sectional view of a device observed at each production step involved in an embodiment of a method of making a semiconductor device according to the present invention. This embodiment is an example of the method of making the semiconductor device 20 of the second embodiment illustrated in FIG. 2. In FIG. 10, the same elements as those of FIG. 2 are referred to by the same numerals, and a description thereof will be omitted. As illustrated in FIG. 10(a), a solid bonding material 25, the base plate 21 made of Si or SiC, the solid conductive bonding material 15, and the semiconductor chip 13 are successively stacked on the heatsink plate 23. The base plate 21 has a linear expansion coefficient of 2 to 10 ppm/K. The solid conductive bonding material 15, which is placed on the circuit pattern situated on the surface of the base plate 21, is made of a predetermined material, and has a thickness of approximately 50 micrometers. The semiconductor chip 13 has a thickness of 350 micrometers and a linear expansion coefficient of 3 to 4 ppm/K.

The thickness of the bonding material 25 is thinner than or equal to 1/7 of the thickness of the thinner of the base plate 21 or the heatsink plate 23. The heatsink plate 23 used here has a linear expansion coefficient that is set such as to differ from the linear expansion coefficient of the base plate 21 by 7 ppm/K or smaller in absolute value. Subsequently, the entirety of the stacked structure illustrated in FIG. 10(a) is heated to melt the conductive bonding material 15 and the bonding material 25. As a result, the semiconductor device 20 of the second embodiment is made as illustrated in FIG. 10(b), having the structure in which the electrodes of the semiconductor chip 13 are bonded to the circuit pattern of the base plate 21 via the conductive bonding layer 12, and the heatsink plate 23 is bonded via the bonding layer 22 to the opposite surface of the base plate 21 from the surface to which the semiconductor chip 13 is bonded. The bonding layer 12 is obtained by melting the conductive bonding material 15. The bonding layer 22 is obtained by melting the bonding material 25. The thickness of these is 50 micrometers or smaller. It may be noted that during the above-noted heating process, heat may be applied while pressure is applied.

According to the production methods illustrated in FIG. 10, the semiconductor device 20 can be made through an extremely small number of production steps involving electrically coupling the semiconductor chip 13 while heating the bonding materials 15 and 25 disposed on the base plate 21 in a single heating step. This method thus eliminates the problem of an increase in manufacturing cost as observed in the semiconductor device disclosed in Patent Document 2.

EXAMPLES

In the following, a first example serving as an example of the semiconductor device 20 and a second example serving as an example of the semiconductor device 60 will be described in comparison with an example of a conventional semiconductor device.

First Example

Figure 11:
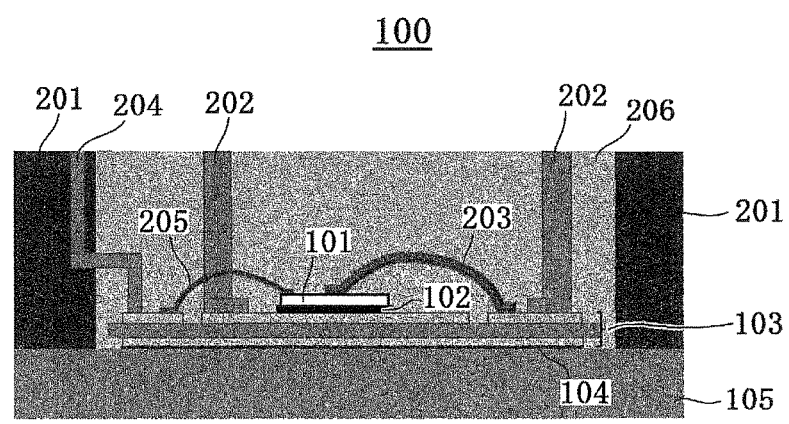
FIG. 11 is a cross-sectional view of the structure of a first example of a semiconductor device according to the present invention.

FIG. 11 is a cross-sectional view of the structure of the first example of a semiconductor device according to the present invention. A semiconductor device 100 of the present example is an example of the semiconductor device 20 illustrated in FIG. 2 as applied to a power module. In FIG. 11, a semiconductor chip 101 (equivalent to 13 in FIG. 2), which is made of SiC having a linear expansion coefficient of 4 ppm/K, has the lower surface thereof connected to the surface of an insulating substrate 103 serving as a base plate (equivalent to 21 in FIG. 2) via a semiconductor-chip bonding layer 102 (equivalent to 12 in FIG. 2). The bonding layer 102 is made of a metal sintered compact that is 50 micrometers thick. Further, the insulating substrate 103, which has a three-layer structure in which the upper and lower surfaces of a flat-plate ceramic substrate are coated with copper foils, has a linear expansion coefficient of 5.2 ppm/K. Accordingly, the absolute value of a difference between the thermal expansion coefficient of the semiconductor chip 101 and the thermal expansion coefficient of the insulating substrate 103 is 7 ppm/K or smaller in the present example.

The opposite surface of the insulating substrate 103 from the surface which is bonded to the semiconductor chip 101 is bonded to a heatsink plate 105 (equivalent to 23 in FIG. 2) via an insulting-substrate bonding layer 104 (equivalent to 22 in FIG. 2). The bonding layer 104 is made of a solder material having a composition of Sn-5Sb comprised of Sn and antimony (Sb). The heatsink plate 105, which is made of a metal compound material AlSiC, has a linear expansion coefficient of 7.5 ppm/K. Accordingly, the absolute value of a difference between the thermal expansion coefficient of the heatsink plate 105 and the thermal expansion coefficient of the insulating substrate 103 is 7 ppm/K or smaller in the present example.

The major components of the semiconductor device having the above-noted configuration are stored in a resin case 201. Further, the semiconductor chip 101 is bonded via Al wires 203 to main-circuit external terminals 202 disposed in the resin case 201, and is also bonded via an Al wire 205 to a drive-signal external terminal 204 disposed in the resin case 201. The major components of the wire-bonded semiconductor device are then encapsulated with an encapsulating material (e.g., silicone gel) 206 filling the inside of the resin case 201, thereby forming a power module. TABLE1 shows names, materials, linear expansion coefficients, and thermal resistances of the major components of the semiconductor device 100 of the above-noted present example. "THERMAL RESISTANCE" in TABLE1 indicates the proportion of terminal resistance of each component when the total thermal resistance from the upper surface of the semiconductor chip 101 to the lower surface of the heatsink plate 105 is expressed as "1".

TABLE 1

| SYMBOL | NAME | MATERIAL | LINEAR EXPANSION COEFFICIENT (ppm/K) | THERMAL RESISTANCE* |
|---|---|---|---|---|
| 101 | Semiconductor Chip | SiC | 4 | 0.07 |
| 102 | Bonding Layer For Semiconductor Chip | Metal Sintered Compact 50 μm or thinner | (5.2) *expand/contract by conforming to insulating substrate | 0.02 |
| 103 | Insulating Substrate | Ceramic Coated With Cu | 5.2 | 0.35 |
| 104 | Bonding Layer For Insulating Substrate | Sn—5Sb | (7.5) *expand/contract by conforming to heatsink plate | 0.17 |
| 105 | Heatsink Plate | AlSiC | 7.5 | 0.41 |

*"THERMAL RESISTANCE" in the table is the proportion of thermal resistance of each component when heat resistance from the upper surface of the semiconductor chip to the lower surface of the heatsink plate is set to 1.0

The semiconductor device 100 of the present example having the above-described configuration uses AlSiC for the heatsink plate 105 in order to provide that the absolute value of a difference from the thermal expansion coefficient of the insulating substrate 103 is 7 ppm/K or smaller. However, this has a slightly larger thermal resistance than a conventional heatsink plate made of Cu (with a linear expansion coefficient of 16 ppm/K). As was previously described, however, the present example provides that the absolute value of a difference in the displacement between the insulating substrate 103 and the heatsink plate 105 in response to a temperature change is relatively small, thereby avoiding the problems such as a decrease in the dissipation area and lowering in cooling performance caused by the warpage of the insulating substrate 103 and the heatsink plate 105. Further, the provision of the thinly-made bonding layers 102 and 104 serves to avoid the unevenness of bonding thickness. Even when stress occurs at the bonding layers 102 and 104, the stress is dispersed without concentrating on a single point.

Second Example

Figure 12:
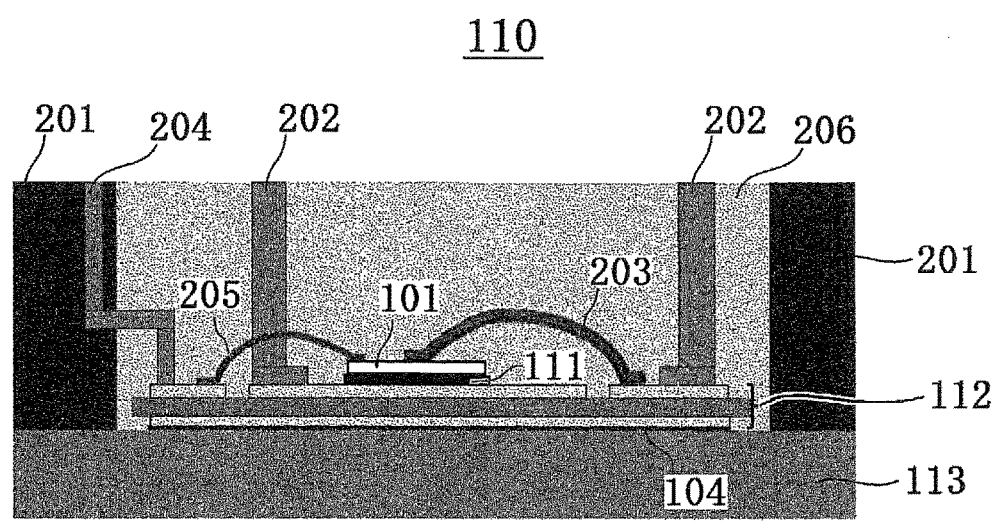
FIG. 12 is a cross-sectional view of the structure of a second example of a semiconductor device according to the present invention.

FIG. 12 is a cross-sectional view of the structure of the second example of a semiconductor device according to the present invention. In this drawing, the same elements as those of FIG. 11 are referred to by the same symbols, and a description thereof will be omitted. A semiconductor device 110 of the present example is an example of the semiconductor device 60 illustrated in FIG. 6 as applied to a power module. In FIG. 12, a semiconductor chip 101 (equivalent to 13 in FIG. 6), which is made of SiC having a linear expansion coefficient of 4 ppm/K, has the lower surface thereof connected to the surface of an insulating substrate 112 serving as a base plate (equivalent to 21 in FIG. 6) via a semiconductor-chip bonding layer 111 (equivalent to 61 in FIG. 6). The bonding layer 111 is a Cu sintered compact having a thickness of 50 micrometers and a compactness of 96% or higher. The bonding layer 111 may alternatively be a metal sintered compact made of Ag, Ni, or the like. Further, the insulating substrate 112, which has a three-layer structure in which the upper and lower surfaces of a flat-plate SiN substrate are coated with copper foils, has a linear expansion coefficient of 5.2 ppm/K. Accordingly, the absolute value of a difference between the thermal expansion coefficient of the semiconductor chip 101 and the thermal expansion coefficient of the insulating substrate 112 is 7 ppm/K or smaller in the present example.

The opposite surface of the insulating substrate 112 from the surface which is bonded to the semiconductor chip 101 is bonded to a heatsink plate 113 (equivalent to 63 in FIG. 6) via an insulting-substrate bonding layer 104 (equivalent to 62 in FIG. 6). The heatsink plate 113 is comprised of a copper-invar-copper (CIC) compound material, which is an example of a metal compound material having a thermal conductivity of 250 W/mK or higher, which is higher than that of Cu (i.e., lower in thermal resistance than Cu). The heatsink plate 113 made of a copper-invar-copper compound material has a high thermal conductivity of 280 W/mK or higher in the thickness direction, and has a linear expansion coefficient of 11.0 ppm/K. Accordingly, the absolute value of a difference between the thermal expansion coefficient of the heatsink plate 113 and the thermal expansion coefficient of the insulating substrate 112 is 7 ppm/K or smaller in the present example.

The major components of the semiconductor having the above-noted configuration are stored in the resin case 201, and are wire-bonded to the main-circuit external terminals 202 and to the drive-signal external terminal 204, followed by being encapsulated with an encapsulating material (e.g., silicone gel) 206 in the resin case 201 to constitute a power module. TABLE2 shows names, materials, linear expansion coefficients, and thermal resistances of the major components of the semiconductor device 110 of the above-noted present example. "THERMAL RESISTANCE" in TABLE2 indicates the proportion of terminal resistance of each component when the total thermal resistance from the upper surface of the semiconductor chip 101 to the lower surface of the heatsink plate 113 is expressed as "1".

TABLE 2

| SYMBOL | NAME | MATERIAL | LINEAR EXPANSION COEFFICIENT (ppm/K) | THERMAL RESISTANCE* |
|---|---|---|---|---|
| 101 | Semiconductor Chip | SiC | 4 | 0.07 |
| 111 | Bonding Layer For Semiconductor Chip | Metal Sintered Compact (Ag, Cu, Ni) | (5.2) *expand/contract by conforming to insulating substrate | 0.02 |
| 112 | Insulating Substrate | Cu/SiN/Cu | 5.2 | 0.38 |
| 104 | Bonding Layer For Insulating Substrate | Sn—5Sb | (11.0) *expand/contract by conforming to heatsink plate | 0.17 |
| 113 | Heatsink Plate | CIC Compound Material | 11.0 | 0.21 |

*"THERMAL RESISTANCE" in the table is the proportion of thermal resistance of each component when heat resistance from the upper surface of the semiconductor chip to the lower surface of the heatsink plate is set to 1.0

In the semiconductor device 110 of the present example having the above-noted configuration, the proportion of thermal resistance of the heatsink plate is small (i.e., thermal conductivity is high) relative to the total thermal resistance from the upper surface of the semiconductor chip 101 to the lower surface of the heatsink plate 113. This is because the metal compound material used for the heatsink plate 113 is a copper-invar-copper compound material, which has such a thermal expansion coefficient that the absolute value of a difference from the thermal expansion coefficient of the insulating substrate 103 is 7 ppm/K or smaller, and which has a thermal conductivity higher than a conventional heatsink plate made of Cu (having a linear expansion coefficient of 16 ppm/K). With this configuration, the semiconductor device 110 is able to improve heat dissipation in comparison with the semiconductor device 100 with expectations for the coexistence of improvement in heat dissipation with improvement in reliability for thermal cycle stress.

In the following, a description will be given of the results of comparison between the semiconductor devices 100 and 110 according to the examples and a conventional semiconductor device. A semiconductor device constituting a conventional power module used here is a power module having the structure designed based on the disclosures of Japanese Patent Application Publication No. 2005-129886 and a document (Fujitsu Report, Vol. 71, No. 2, 1988: FIG. 1 and FIG. 2). The structure of this conventional semiconductor device is such that a semiconductor chip made of Si (with a linear expansion coefficient of 3 ppm/K) is connected to a surface of an insulating substrate via a solder bonding layer (with a linear expansion coefficient of 20 to 25 ppm/K) having a thickness of 100 micrometers or greater. In this structure, further, the opposite surface of the insulating substrate from the surface bonded to the semiconductor chip is bonded to a heatsink plate made of Cu via a solder bonding layer. TABLE3 shows names, materials, linear expansion coefficients, and thermal resistances of the major components of the conventional semiconductor device. "THERMAL RESISTANCE" in TABLE3 indicates the proportion of terminal resistance of each component when the total thermal resistance from the upper surface of the semiconductor chip to the lower surface of the heatsink plate is expressed as "1".

TABLE 3

| NAME | MATERIAL | LINEAR EXPANSION COEFFICIENT (ppm/K) | THERMAL RESISTANCE* |
|---|---|---|---|
| Semiconductor Chip | Si | 3 | 0.07 |
| Bonding Layer For Semiconductor Chip | Solder 100 μm or thicker | 20-25 *expand/contract by conforming to insulating substrate | 0.18 |
| Insulating Substrate | Ceramic Coated With Cu | 9.0 | 0.33 |
| Bonding Layer For Insulating Substrate | Solder | 20-25 | 0.20 |
| Heatsink Plate | Cu | 16 | 0.21 |

*"THERMAL RESISTANCE" in the table is the proportion of thermal resistance of each component when heat resistance from the upper surface of the semiconductor chip to the lower surface of the heatsink plate is set to 1.0

The relationship between thermal distortion and thermal resistance under the constant temperature change condition is shown in TABLE4 with respect to each of the above-noted conventional semiconductor device, the semiconductor device 100 of the first example of the present invention, and the semiconductor device 110 of the second example. It may be noted that "THERMAL RESISTANCE" in TABLE4 is a normalized value under the condition that the thermal resistance of the conventional semiconductor device is normalized to "1".

TABLE 4

| | CONVENTIONAL DEVICE | FIRST EXAMPLE 100 | SECOND EXAMPLE 110 |
|---|---|---|---|
| THERMAL RESISTANCE | 1 | 1.03 | 0.82 |
| THERMAL DISTORTION | LARGE | SMALL | SMALL |

As shown in TABLE4, the thermal distortions of the semiconductor device 100 of the first example and the semiconductor device 110 of the second example are successfully made smaller than that of the conventional semiconductor device having the structure shown in TABLE3. The total thermal resistance of the semiconductor device 100 is higher than the conventional device, which is disadvantageous in terms of heat dissipation because a temperature change increases as thermal resistance increases under the condition of a constant amount of heat generation. However, the semiconductor device 100 has the bonding layer 104 that is thinner than in the conventional device, and, also, the linear expansion coefficient of the insulating substrate 103 is close to the linear expansion coefficient of the heatsink plate 105. Because of this, a displacement occurring between the insulating substrate 103 and the heatsink plate 105 in response to a temperature change is reduced to a relatively small size, thereby successfully reducing thermal distortion in comparison with the conventional device. Further, the semiconductor device 110 provides thermal resistance that is also smaller than that of the conventional device, and is thus expected to ensure the coexistence of improvement in heat dissipation with improvement in reliability against thermal cycle stress.

It may be noted that the present invention is not limited to the above-noted embodiments, and various variations may be made. For example, the thickness of the bonding layers 22 and 52 for bonding the heatsink plates 23 and 52 to the base plates 21 and 41, respectively, may be slightly thicker than the examples of the embodiments. Further, reduction in thermal distortion occurring between the semiconductor chip 13 and the bonding layers 12, 32, and 42 is predicated on the firm bonding thereof to the base plates 11, 31, 41, respectively. It is thus preferable that not only the bonding material is merely disposed on or applied to the base plates 11, 31, and 41, but also some measures are taken to ensure firmer bonding.

Moreover, provision may be made that a semiconductor chip 13 made of SiC is bonded by using a plate made of Mo having a linear expansion coefficient of 5.1 ppm/K as the base plates 11, 21, 31, and 41, and also by using an Ag sintered bonding material having a thickness of 40 micrometers as the bonding layers 12, 32, and 42. Alternatively, a Cu—Mo compound material having a linear expansion coefficient of 5.1 to 10.0 ppm/K may be used as the base plates 11, 21, 31, and 41. Further, provision may be made that the base plates 11, 21, 31, and 41 are made by applying metal plates on both surfaces of a ceramic plate having a small linear expansion coefficient and made of silicon nitride, aluminum nitride, alumina, or the like, and that an apparent linear expansion coefficient calculated based on the Young's modulus, linear expansion coefficient, and plate thickness of each material constituting the base plate is adjusted to be equal to 2 to 10 ppm/K.

The invention claimed is:

1. A semiconductor device, comprising:
a semiconductor chip having electrodes situated on a surface thereof;
a first base plate having a linear expansion coefficient that differs from a linear expansion coefficient of the semiconductor chip by an absolute value of 7 ppm/K or smaller, the first base plate having a circuit pattern situated on a surface thereof; and
a first bonding layer electrically connecting the first base plate to the semiconductor chip and having a thickness thinner than the semiconductor chip, wherein the first bonding layer is a metal sintered compact in direct contact with, and bonding, the circuit pattern of the first base plate and the electrodes of the semiconductor chip.

2. A semiconductor device, comprising:
a semiconductor chip;
a first base plate having a linear expansion coefficient that differs from a linear expansion coefficient of the semiconductor chip by an absolute value of 7 ppm/K or smaller;
a first bonding layer electrically connecting the first base plate to the semiconductor chip and having a thickness thinner than the semiconductor chip;
a first heatsink plate having a linear expansion coefficient that differs from the linear expansion coefficient of the first base plate by an absolute value of 7 ppm/K or smaller; and
a second bonding layer bonding, to the first heatsink plate, an opposite surface of the first base plate from a surface thereof to which the semiconductor chip is bonded.

3. The semiconductor device as claimed in claim 2, wherein the first bonding layer has a thickness of 50 micrometers or smaller.

4. The semiconductor device as claimed in claim 2, wherein the first bonding layer is made of a metal sintered compact.

5. The semiconductor device as claimed in claim 2, wherein the first heatsink plate is made of a metal compound material which has a linear expansion coefficient that differs from the linear expansion coefficient of the first base plate by an absolute value of 7 ppm/K or smaller, and which has a thermal conductivity of 250 W/mK or higher, and
wherein the second bonding layer is formed of a sintered compact containing at least one of Ag, Cu, and Ni, or formed of a solder having a melting point of 250 degrees Celsius or higher containing at least one of Au, Zn, Bi, Cu, Pb, and Sn.

6. The semiconductor device as claimed in claim 4, wherein the metal sintered compact of the first bonding layer has a compactness of 96% or higher.

7. The semiconductor device as claimed in claim 5, wherein the metal compound material of the first heatsink plate is a copper-inver-copper (CIC) compound material having a thermal conductivity of 280 W/mK or higher in a thickness direction.

8. The semiconductor device as claimed in claim 2, further comprising:
a second base plate having a linear expansion coefficient that differs from the linear expansion coefficient of the semiconductor chip by an absolute value of 7 ppm/K or smaller; and
a third bonding layer having a thickness of 50 micrometers or smaller, and bonding, to the second base plate, an opposite surface of the semiconductor chip from a surface thereof which is bonded to the first base plate.

9. The semiconductor device as claimed in claim 2, further comprising:
a second base plate having a linear expansion coefficient that differs from the linear expansion coefficient of the semiconductor chip by an absolute value of 7 ppm/K or smaller; and
a third bonding layer having a thickness of 50 micrometers or smaller, and bonding, to the second base plate, an opposite surface of the semiconductor chip from a surface thereof which is bonded to the first base plate;
a second heatsink plate having a linear expansion coefficient that differs from the linear expansion coefficient of the second base plate by an absolute value of 7 ppm/K or smaller; and a fourth bonding layer bonding, to the second heatsink plate, an opposite surface of the second base plate from a surface thereof to which the semiconductor chip is bonded.

10. The semiconductor device as claimed in claim 2, wherein the first base plate is a stacked-layer structure in which a first conductive layer, an insulating layer, and a second conducive layer are stacked in a thickness direction.

11. A method of making a semiconductor device, comprising:
   a first step of forming a structure which has, upon the first heatsink plate of claim 2, a solid bonding material for the second bonding layer, the first base plate, a solid conductive bonding material for the first bonding layer, and the semiconductor chip having a linear expansion coefficient that differs from the linear expansion coefficient of the first base plate by an absolute value of 7 ppm/K or smaller, successively stacked in this order; and
   a second step of bonding the first heatsink plate and the base plate via the second bonding layer obtained by melting the solid bonding material for the second bonding layer upon heating an entirety of the structure, and, simultaneously therewith, bonding the base plate and the semiconductor chip via the first bonding layer having the predetermined thickness obtained by melting the solid conductive bonding material for the first bonding layer.

12. The semiconductor device as claimed in claim 1, wherein the first bonding layer has a thickness of 50 micrometers or smaller.

13. The semiconductor device as claimed in claim 1, wherein the metal sintered compact of the first bonding layer has a compactness of 96% or higher.

14. The semiconductor device as claimed in claim 1, further comprising:
   a second base plate having a linear expansion coefficient that differs from the linear expansion coefficient of the semiconductor chip by an absolute value of 7 ppm/K or smaller; and
   a second bonding layer having a thickness of 50 micrometers or smaller, and bonding, to the second base plate, an opposite surface of the semiconductor chip from a surface thereof which is bonded to the first base plate.

15. The semiconductor device as claimed in claim 1, wherein the first base plate is a stacked-layer structure in which a first conductive layer, an insulating layer, and a second conducive layer are stacked in a thickness direction.

* * * * *